United States Patent [19]

Lo

[11] 4,409,564

[45] Oct. 11, 1983

[54] PULSE DELAY COMPENSATION FOR FREQUENCY SYNTHESIZER

[75] Inventor: Kwok S. Lo, San Diego, Calif.

[73] Assignee: Wavetek, San Diego, Calif.

[21] Appl. No.: 245,996

[22] Filed: Mar. 20, 1981

[51] Int. Cl.³ .............................................. H03L 7/18
[52] U.S. Cl. ....................................... 331/16; 331/25; 377/110
[58] Field of Search ....................... 331/1 A, 16, 18, 25; 328/25, 39, 46, 155

[56] References Cited

U.S. PATENT DOCUMENTS 3,959,737 5/1976 Tanis .................................... 331/1 A
4,179,670 12/1979 Kingsbury ......................... 331/16 X Primary Examiner—Siegfried H. Grimm Attorney, Agent, or Firm—Charles H. Schwartz; Ellsworth R. Roston

[57] ABSTRACT

A pulse delay compensator for use with a divide counter dividing a frequency signal by a first positive integer or a second positive integer to produce a divided frequency signal and with the first and second positive integers a fixed number of integers apart and including controlling the divide counter to divide the frequency signal by the first or second positive integers, repetitively summing a fixed fractional number with each divide and with the control of the divide counter in accordance with each overflow produced by the repetitive summing, and producing pulse delay compensation for the divided frequency signal in accordance with the repetitive summing to equalize the pulse period between adjacent pulses in the divided frequency signal.

16 Claims, 10 Drawing Figures

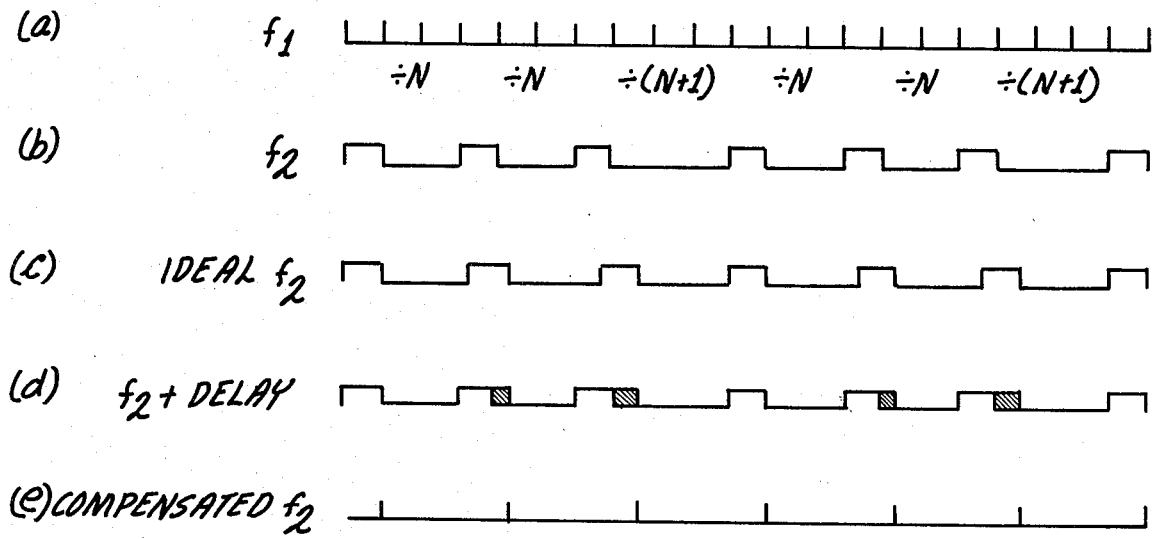
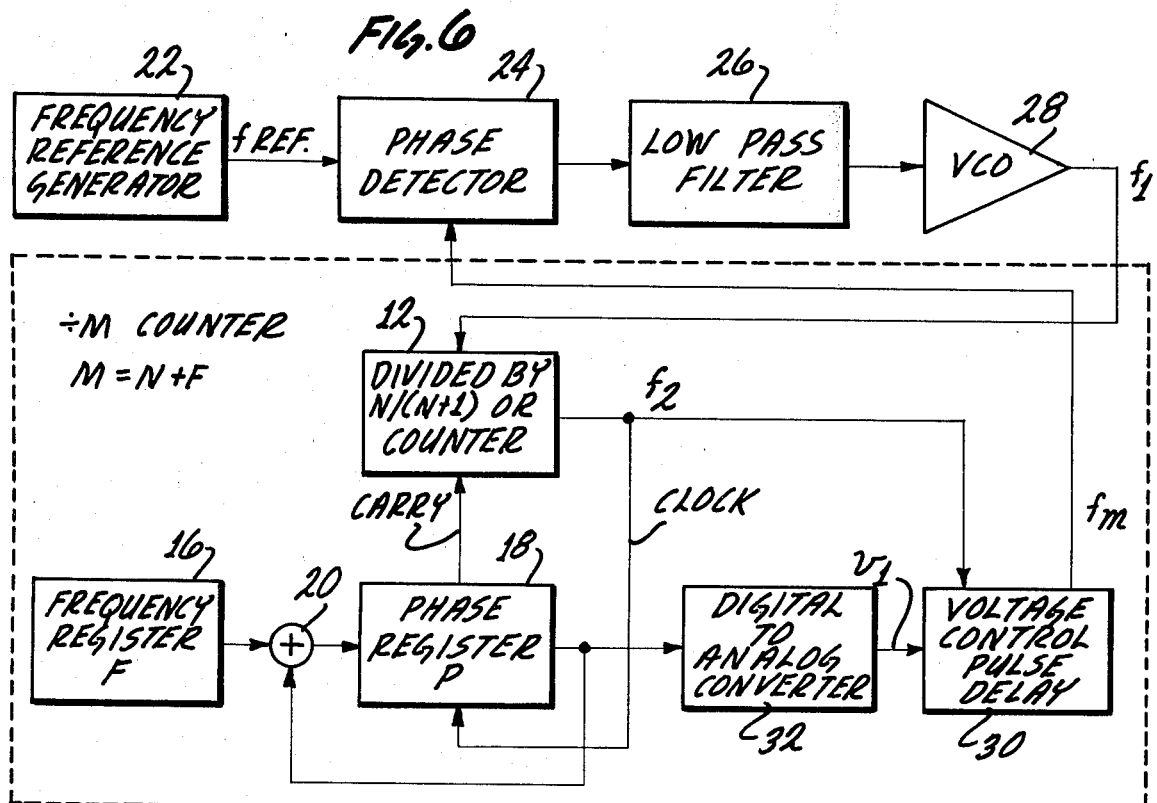

PULSE DELAY COMPENSATION FOR FREQUENCY SYNTHESIZER

BACKGROUND OF THE INVENTION

1. Field of the Invention

The present invention is directed to an apparatus for providing pulse delay compensation in a phase lock loop for use in a frequency synthesizer. Specifically, the pulse delay compensation of the present invention compensates for spurious frequencies which would develop from variations in pulse period in the phase lock loop and which in turn results in jittering and poor spectral purity for the output frequency signals from the frequency synthesizer.

2. Description of the Prior Art

Frequency synthesizers have been used to provide for the generation of output signals of a desired frequency. In particular, one type of frequency synthesizer uses a phase lock loop to control the frequency of the output signal. In this type of frequency synthesizer, a frequency reference signal is applied as a first input to a phase detector and with the output of the phase detector coupled through a low pass filter to be applied as an input to a voltage controlled oscillator. The output of the voltage controlled oscillator is the desired output signal of the desired frequency and in order to control the frequency of the output signal, a feedback path is established between the output of the voltage controlled oscillator and a second control input for the phase detector. The feedback path includes a frequency counter to divide the frequency of the output signal from the voltage controlled oscillator to control the phase detector in accordance with a coincidence between both inputs to the phase detector.

This type of conventional single phase lock loop frequency synthesizer has a practical limitation as to the number of digit resolution that can be achieved. For example, in some cases as low as three (3) digits may be considered to be not practical because the output signal may be degraded due to a spurious frequency level. In order to increase the number of digit resolution the prior art has used a phase accumulator circuit forming part of the feedback in the phase lock loop. The phase accumulator technique, in theory, has almost no practical limit as to the number of digit resolution. However, this phase accumulator technique will also produce a high level of spurious frequencies since there is a variation in the pulse period in the feedback signal which results from the use of the phase accumulator circuit.

In the prior art the counter in the feedback path is modified and programmed to divide either by N (a positive integer) or divide by N+1 at periodic times during a sequence. The counter could also divide by N−1 instead of N+1 but in the present application, the example used is to divide by N+1. By periodically dividing by N+1 the practical effect is to increase the number of digit resolution in an almost unlimited fashion. However, because the output signal from the voltage controlled oscillator is sometimes divided by N and other times by N+1, the pulse period for the divisions is not always equal. The variation in the pulse period therefore results as jittering and poor spectral purity in the output signal from the voltage controlled oscillator.

SUMMARY OF THE INVENTION

The present invention is directed to a pulse delay compensation for a frequency synthesizer. In particular, the present invention provides for an apparatus and method of averaging the pulse period by which the output signal from the voltage controlled oscillator is divided so as to substantially improve the spectral purity of the output signal from the frequency synthesizer.

In a particular example of the present invention the counter will divide by N or N+1 at appropriate times in accordance with a carry signal from a phase register. The sum stored in the phase register is continually monitored by a digital to analog converter and with the output of the digital analog converter used to control a voltage controlled pulse delay circuit. The input to the voltage controlled pulse delay circuit is the output from the divide by N or N+1 counter and the output from the voltage controlled pulse delay circuit is controlled by the output signal from the digital to analog converter. In this way, each pulse in the frequency signals supplied to the phase detector in the phase lock loop is continuously controlled to have the proper amount of delay so as to eliminate variations in pulse period. The present invention therefore produces an output signal from the voltage controlled oscillator which is high in spectral purity.

BRIEF DESCRIPTION OF THE DRAWINGS

A clearer understanding of the present invention will be had with reference to the following descriptions and drawings wherein:

FIG. 5 shows a series of waveforms used to explain the operation of the circuit of FIG. 4 and also used to explain desired pulse delay compensation of the present invention;

FIG. 6 illustrates a complete frequency synthesizer circuit constructed in accordance with the teachings of the present invention;

DESCRIPTION OF THE PREFERRED EMBODIMENT

Figure 1:
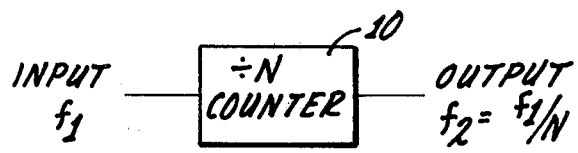
FIG. 1 illustrates a divide by N ($\div$N) counter of a conventional type.

FIG. 1 illustrates a general type of $\div$N counter 10 used as part of the present invention. As shown in FIG. 1, when a periodic signal with a frequency $f_1$ is applied to the input of the $\div$N frequency counter 10, the frequency at the output of the counter is divided and is equal to $f_2$. For practical purposes N can only be a positive integer. Therefore, the relationship between the input and output of the counter 10 is:

$$f_2 = f_1/N$$

where, $f_1$ is the frequency at the input of the counter,
$f_2$ is the frequency at the output of the counter, and
N is a positive integer.

Figure 2A:
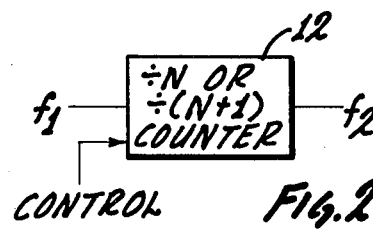
FIG. 2A illustrates a divide by N ($\div$N) or a divide by N+1 ($\div$(N+1)) counter used in the present invention.
Figure 2B:
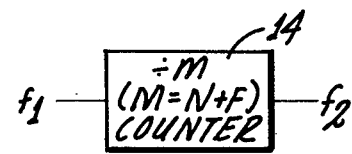
FIG. 2B illustrates a divide by M ($\div$M) counter equivalent to the counter of FIG. 2A.

FIGS. 2A and 2B illustrate a modification of the use of a divide counter to provide for fractional numbers. In particular the counter may be modified as shown in FIG. 2A to be a counter 12 which can be programmed by a control input to either $\div N$ or $\div(N+1)$. By the use of such a divide counter 12 the input frequency $f_1$ may be divided by any positive number including a fractional number such as a fractional number M. The number M may be defined as $M=N+F$ and with M=N if the divide number is an integer and with $M=N+F$ if the divide by number is a fractional number where F is a number less than 1.

FIG. 2B illustrates a modified $\div M$ counter 14 and with the counter shown in FIG. 2B equivalent to the counter shown in FIG. 2B when M and N have the following relationship:

$$M = \frac{A(N) + B(N+1)}{A+B}$$

Where
M is any positive real number
N is a positive integer
A is the number of "$\div N$" in a sequence of "$\div N$" and "$\div(N+1)$".
B is the number of "$\div(N+1)$" in a sequence of "$\div N$" and "$\div(N+1)$".
A+B is the total number of the "$\div N$" and "$\div(N+1)$" in a sequence and the sequence repeats.

As an example, if we consider a sequence having the following pattern:

$$4 \div 4 \div 4 \div 5 \div 4 \div 4 \div 4 \div 5 \div 4 \div 4 \div 4 \div 5$$

therefore N=4, A=3, B=1 and A+B=4. Using the formula above M=4.25.

Figure 3:
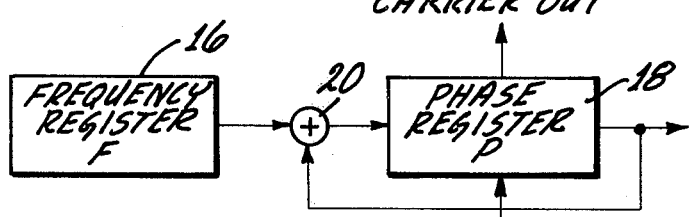
FIG. 3 illustrates a phase accumulator used as part of the present invention.

For any given number M, the pattern in this sequence may be generated using a phase accumulator circuit as shown in FIG. 3. In particular, the phase accumulator of FIG. 3 includes a frequency register 16, a phase register 18 and a digital adder 20. For a given number M which is equal to N+F as defined previously, the fractional number F is stored in the frequency register 16. In each add cycle the number stored in the frequency register 16 is added to the number stored in the phase register 18 which is defined as the number P. The addition is provided by the adder 20 and the output of the adder is placed at the input of the phase register 18.

Each time a clock pulse occurs the sum at the input of the phase register 18 is stored in the phase register 18 to replace the previous number P in the phase register. The new sum in the phase register is now returned as an input to the adder 20 to form a new sum placed at the input of phase register 18 to await a clock pulse. The cycle is then repeated and the number P in the phase register 18 continues to accumulate until the register is full and overflows. When the register 18 overflows a pulse signal is generated as a carry output and the number in the register 18 continues to accumulate starting at the number less than the number in the register 16.

Figure 4:
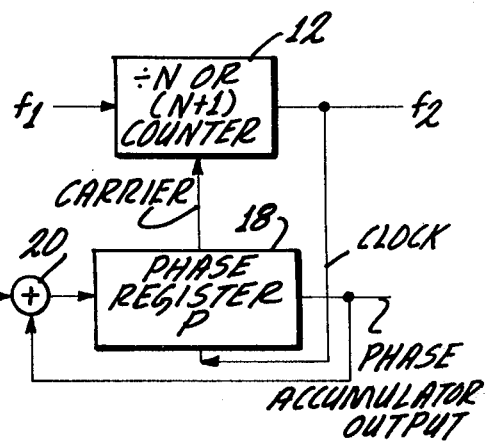
FIG. 4 illustrates a combination of the counter of FIG. 2A and the phase accumulator of FIG. 3 used in the present invention.

FIG. 4 illustrates the combination of the counter 12 of FIG. 2A and the phase accumulator of FIG. 3. The waveforms shown in FIGS. 5(a) and (b) illustrate the input and output signals to and from the counter 12 with the counter under the control of the carry output from the phase register 18. FIGS. 5(c) through (e) illustrate the desired pulse delay compensation which is to be provided by the present invention.

As shown in FIG. 4, if the carry output from the phase register 18 is used to control the $\div N$ or $\div(N+1)$ counter 12 and the output from the counter 12 is connected back to the phase register 18 as the clock signal the result is a complete divide by m counter as shown in FIG. 2B. In particular, every time the signal $f_2$ is switched to high, the phase accumulator will go through an add cycle. As long as there is no carry output from the phase register 18 the counter 12 will divide the input signal $f_1$ by N. However, if there is a carry signal from the phase register 18 the counter 12 will be controlled to divide the input signal $f_1$ by N+1.

As shown in FIG. 5(a), the input signal may be a series of pulses occurring at regular intervals having a particular frequency $f_1$. Because the frequency $f_1$ is sometimes divided by N and at other times by N+1 when under the control of the carry signal from the phase register 18, the pulse period for the output signal $f_2$ is not always equal. This can be seen in FIG. 5(b), as shown by the appropriate pulse periods marked either as $\div N$ or $\div(N+1)$. The variation of the pulse period results in jittering and poor spectral purity from the resultant frequency synthesizer if the circuit as shown in FIG. 4 is used to control a phase lock loop. Therefore, the final signal from the voltage controlled oscillator in the frequency synthesizer also is poor in spectral purity.

Ideally, $f_2$ should have equal pulse periods between each pulse. The ideal $f_2$ is shown in FIG. 5(c) where all of the pulses are spaced by equal pulse periods. This results in some of the pulses in FIG. 5(c) having a delay relative to the pulses shown in FIG. 5(b). The delay could therefore be shown as added to the appropriate ones of the pulses in FIG. 5(b) so as to produce the signal shown in FIG. 5(d). As can be seen, FIG. 5(d) includes a delay added to appropriate ones of the pulses shown in FIG. 5(b) and with the delay shown in the shaded portions. If the signal $f_2$ has the delay added to particular ones of the pulses as shown in FIG. 5(d), a compensated $f_2$ signal may be produced from the trailing edge of the pulse signal shown in FIG. 5(d). The compensated $f_2$ pulse signal is shown in FIG. 5(d) and illustrates a series of pulses produced from the trailing edge of the pulses in FIG. 5(d). The compensated $f_2$ signal as shown in FIG. 5(e) has an equal pulse period between all of the pulses.

Figure 7:
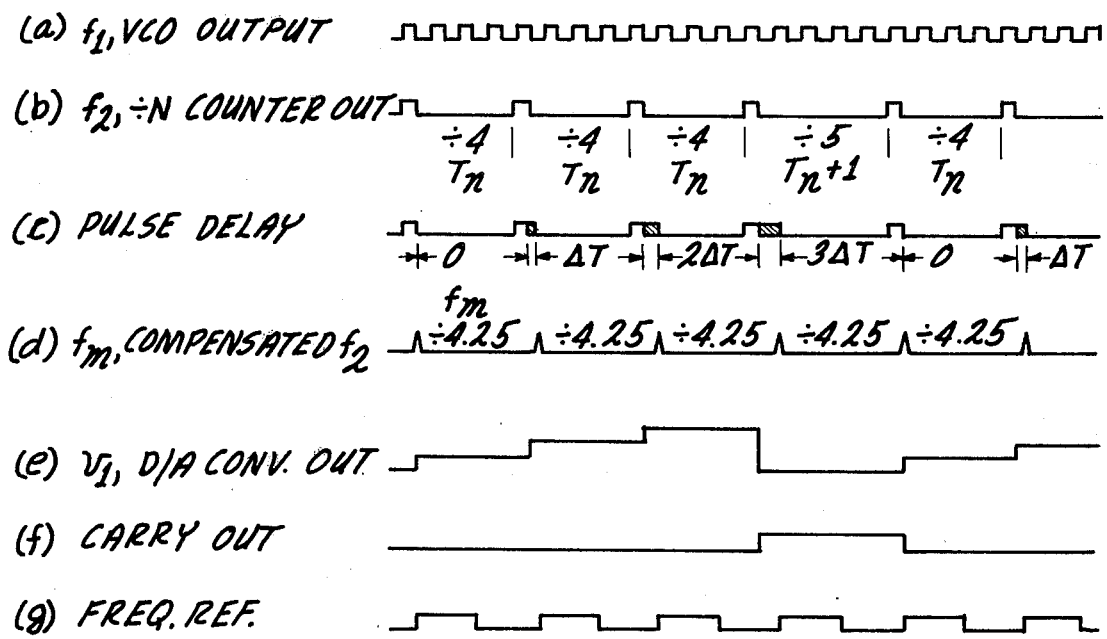
FIG. 7 shows a series of waveforms used to explain the operation of the frequency synthesizer of FIG. 6.

FIG. 6 illustrates a block diagram of a complete frequency synthesizer of the present invention using the circuit of FIG. 4 as part of the feedback path in a phase lock loop. FIG. 7 are series of waveforms (a) through (g) representing the signals of various portions of the system shown in FIG. 6.

In FIG. 6 the synthesizer circuit includes a frequency reference generator 22 producing a reference frequency as shown in FIG. 7(g). The reference frequency is applied as a first input to a phase detector 24 and with the output from the phase detector applied through a low pass filter 26 as an input to a voltage controlled oscillator 28. The output from the voltage controlled oscillator is the signal $f_1$ and represents the frequency synthesized signal at the particular desired frequency. The signal $f_1$ is shown in FIG. 7(a).

The phase detector 24 includes a second feedback input, and with a coincidence between the first and second inputs controlling the operation of the phase detector 24 to provide for the desired synthesized frequency appearing as the output $f_1$ from the voltage controlled oscillator 28. It is therefore desired that the feedback input signal applied to the phase detector 24 be at regular pulse periods, so as to provide for regular pulse periods in the output signal $f_1$.

As shown in FIG. 6 and as described with reference to FIG. 4, the divide counter 12 may produce an output signal $f_2$ which is representative of any given number M. As defined previously, M may be equal to N+F with F being the desired fractional number. In the prior art, the output $f_2$ would be used as the feedback input signal for the phase detector 24. However, in the present invention the frequency signal $f_2$ is used as an input signal to a voltage controlled pulse delay circuit 30 and with the delay produced by the pulse delay circuit 30 controlled by an output signal from a digital to analog converter 32.

The input signal to the digital to analog converter 32 is the output sum signal stored by the phase register 18. As can be seen in FIG. 7(b), the output signal $f_2$ from the divide counter 12 is a series of pulses having different pulse periods. In particular, when the counter 12 divides by N, the pulse period is defined as $T_n$ where $T_n = N/f_1$. If the counter 12 divides by N+1, the pulse period is defined by as $T_{n+1}$ where $$T_{n+1} = \frac{(N+1)}{f_1} = T_n + \frac{1}{f_1}.$$

The average pulse period for the signal $f_2$ is $T_m = M/f_1$. This is because, as explained above, the counter of FIG. 2A is equivalent to the counter of FIG. 2B. The difference between $T_m$ and $T_n$ is $\Delta T$ where $$\Delta T = \frac{(N+F-N)}{f_1} = \frac{F}{f_1}$$

Ideally, the output pulse signal from the voltage controlled pulse delay circuit 30 should be a compensated signal $f_m$ as shown in FIG. 7(d). It would therefore be desirable to modify all of the pulse periods to be equal to $T_m$ to produce the compensated signal as shown by $f_m$.

Therefore, it is apparent that a delay of $\Delta T$ has to be added to the first pulse period $T_n$ and a delay of $2\Delta T$ to the second pulse period $T_n$ and so on as shown in FIG. 7(c). This added delay would continue until $k\Delta T$ is greater than $1/f_1$ where k=successive increases in T until the counter is controlled to go from a $\div N$ to a $\div(N+1)$ and with the delay then returned to $(k\Delta T - 1/f_1)$. The actual amount of delay is controlled by the digital to analog converter 32 which is connected to the output of the phase register 18. The output voltage produced by the digital to analog converter 32 therefore controls the delay produced by the voltage controlled pulse delay circuit 30.

As can be seen by the waveform FIG. 7(e), the output voltage $v_1$ from the digital to analog converter is a stepped signal which increases in accordance with each add cycle which in turn changes the sum stored in the phase register 18. When there is an overflow from the phase register 18, this is represented by a carry signal as shown in FIG. 7(f). The carry signal is used to control the divide counter 12 to divide by (N+1) instead of divide by N. At this time, the output from the digital to analog converter 32 is returned to a level representative of any sum remaining in the phase register 18.

Figure 8:
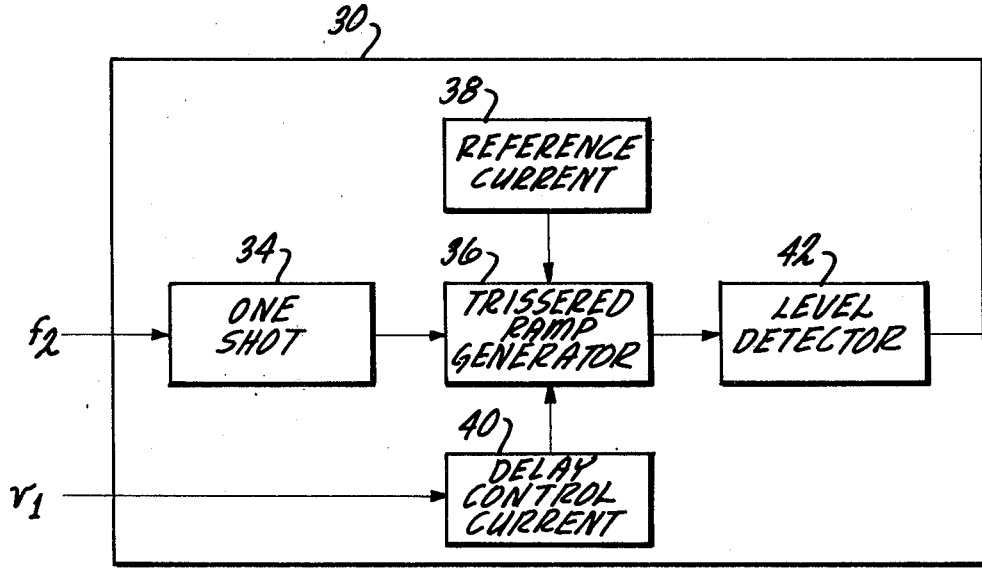
FIG. 8 illustrates a particular voltage controlled pulse delay circuit.
Figure 9:
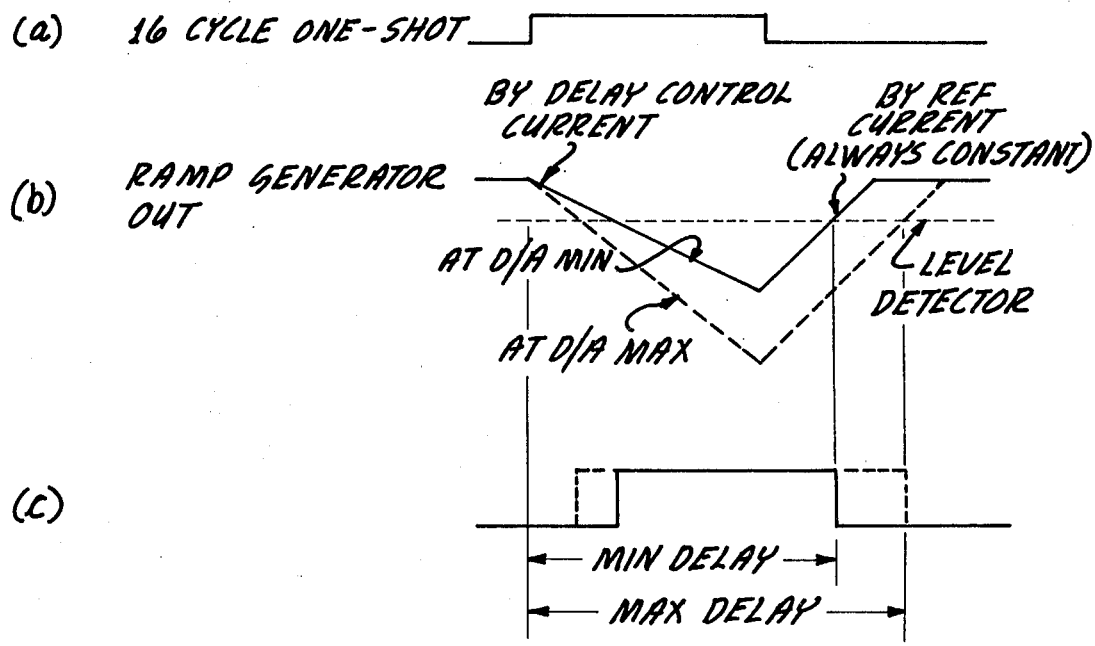
FIG. 9 shows a timing diagram used to explain the operation of the voltage controlled pulse delay circuit.

FIG. 8 illustrates a particular example for a voltage controlled pulse delay circuit 30 which may be used and with the waveforms of FIG. 9 forming a timing diagram of the circuit 30. The output signal $f_2$ from the divide counter 12 is applied as an input to a one-shot multivibrator 34. The output from the one-shot 34 is a pulse as shown in FIG. 9(a). The output from the one-shot 34 is applied as an input to a triggered ramp generator 36 and with the triggered ramp generator having a reference current as shown by reference current 38. The slope of the triggered ramp generator 36 is controlled by a delay control current 40. The input to the delay control current 40 is the output $v_1$ produced by the digital to analog converter 32. The output of the triggered ramp generator 36 is detected by a level detector 42 to produce the compensated frequency signal $f_m$.

The triggered ramp generator 36 is referenced by the reference current 38 and starts a negative ramp under the control of the leading edge of the pulse from the one-shot 34. This is shown in FIGS. 9(a) and 9(b). The slope of the ramp is under the control of the delay control current 40 and as shown in the waveform of FIG. 9(b) the slope can vary between the full line and dotted line positions.

At the trailing edge of the pulse from the one-shot 34, the output signal from the triggered ramp generator 36 ramps back at a uniform slope until a particular level is reached. The particular level is shown by the dotted line in FIG. 9(b) and with the level detector 42 detecting the particular level to produce each output pulse forming part of the output frequency signal $f_m$. As can be seen in FIG. 9(c), the output pulse produced by the level detector 42 may be delayed between the points of minimum delay and maximum delay in accordance with the level of voltage from the digital to analog converter 32 since the level of the voltage from the digital to analog converter 32 controls the slope of the signal produced by the triggered ramp generator 36. The actual range of delay between the minimum and maximum delay shown in FIG. 8(c) may be controlled by the value of the digital to analog converter 32 so that the range may be increased or decreased depending upon an adjustment of the delay control current 40 which is controlled by the digital to analog converter 32.

The present invention therefore provides for a pulse delay compensation for a frequency synthesizer so as to eliminate any variation in pulse period in the output from a multi-number divide counter which is used as part of a phase lock loop frequency synthesizer.

Although the application has been described with reference to a particular embodiment, it is to be appreciated that various adaptations and modifications may be made and the invention is only to be limited by the appended claims.

I claim:

1. Apparatus for providing pulse delay compensation for a frequency synthesizer producing an output frequency signal including
    means for generating a reference frequency,
    means coupled to the generating means for providing a phase detection of the reference frequency in accordance with a control signal and for providing an output signal having a value in accordance with the phase detection,
    means coupled to the phase detection means for producing a voltage signal having an amplitude in accordance with the value of the output signal, means coupled to the voltage producing means for producing the output frequency signal having a frequency in accordance with the amplitude of the voltage signal, means coupled to the output frequency producing means for dividing the output frequency signal by a first positive integer or a second positive integer to produce a divided frequency signal having a division ratio equivalent to a number including an integer and a fixed fractional number and with the first and second positive integers a number of integers apart and with the control of the dividing means in accordance with a carry signal, means coupled to the dividing means for producing a carry signal and including means for repetitively summing the fractional number to produce a summation upon each divide of the output frequency signal by the dividing means and with each overflow in excess of a predetermined summation value forming the carry signal used to control the dividing means, means coupled to the dividing means and responsive to the repetitive summation of the fractional number for producing a pulse delay compensation for the divided fequency signal in accordance with the repetitive summation to produce a control signal having substantially uniform pulse periods for coupling to the phase detection means.

2. The apparatus of claim 1 wherein
the first and second positive integers are one integer apart.

3. The apparatus of claim 2 wherein
the first positive integer is defined by N and the second positive integer is defined by (N+1).

4. The apparatus of claim 1 wherein
the means for producing a carry signal is formed by a frequency register storing the fractional number and a phase register storing the repetitive summations of the fractional number with the previous summation in the phase register.

5. The apparatus of claim 1 wherein
the means for producing the pulse delay compensation includes a digital to analog converter responsive to the repetitive summation to produce a voltage signal having a level in accordance with the repetitive summation and with the voltage signal controlling the pulse delay compensation for the divided frequency signal.

6. A divide counter with pulse delay compensation for use in a phase lock loop frequency synthesizer, including, means for dividing a frequency signal by a first positive integer or a second positive integer to produce a divided frequency signal having a division ratio equivalent to a number including an integer and a fixed fractional number and with the first and second positive integers a number of integers apart, means coupled to the dividing means for controlling the dividing means to divide the frequency signal by the first or second positive integers, the controlling means including means for repetitively summing the fixed fractional number to produce a summation with each divide by the dividing means and with the control of the dividing means in accordance with each overflow in excess of a predetermined summation value produced by the repetitive summing, and means coupled to the dividing means and to the repetitive summing means for producing pulse delay compensation for the divided frequency signal in accordance with the repetitive summing to equalize the pulse period between adjacent pulses in the divided frequency signal.

7. The divide counter of claim 6 wherein
the first and second positive integers are one integer apart.

8. The divide counter of claim 7 wherein
the first positive integer is defined by N and the second positive integer is defined by (N+1).

9. The divide counter of claim 6 wherein
the repetitive summing means includes a frequency register storing the fractional number and a phase register storing the repetitive summings of the fractional number with the previous sum in the phase register.

10. The divide counter of claim 6 wherein
the means for producing the pulse delay compensation includes a digital to analog converter responsive to the repetitive summing to produce a voltage signal having a level in accordance with the repetitive summing and with the voltage signal controlling the pulse delay compensation for the divided frequency signal.

11. A pulse delay compensator for use with a divide counter dividing a frequency signal by a first positive integer or a second positive integer to produce a divided frequency signal having a division ratio equivalent to a number including an integer and a fixed fractional number and with the first and second positive integers a number of integers apart, including, means for controlling the divide counter to divide the frequency signal by the first or second positive integer, the controlling means including means for repetitively summing the fixed fractional number to produce a summation with each divide by the dividing means and with the control of the divide counter in accordance with each overflow in excess of a predetermined summation value produced by the repetitive summing, and means coupled to the divide counter and to the repetitive summing means for producing pulse delay compensation for the divided frequency signal in accordance with the repetitive summing to equalize the pulse period between adjacent pulses in the divided frequency signal.

12. The pulse delay compensator of claim 11 wherein
the first and second positive integers are one integer apart.

13. The pulse delay compensator of claim 12 wherein
the first positive integer is defined by N and the second positive integer is defined by (N+1).

14. The pulse delay compensator of claim 11 wherein
the repetitive summing means includes a frequency register storing the fractional number and a phase register storing the repetitive summings of the fractional number with the previous sum in the phase register.

15. The pulse delay compensator of claim 11 wherein
the means for producing the pulse delay compensation includes a digital to analog converter responsive to the repetitive summing to produce a voltage signal having a level in accordance with the repetitive summing and with the voltage signal controlling the pulse delay compensation for the divided frequency signal.

16. The pulse delay compensator of claim 15 wherein
the level of the voltage signal controls the slope of a signal from a ramp generator and with the pulse delay controlled by the detection of a particular level of the signal from the ramp generator.

* * * * *